US006890774B2

(12) United States Patent
Flanner et al.

(10) Patent No.: US 6,890,774 B2
(45) Date of Patent: May 10, 2005

(54) SYSTEM AND METHOD FOR CREATING A SUBSTRATE SIGNATURE

(75) Inventors: Janet M. Flanner, Union City, CA (US); James C. Vetter, Pine Grove, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/310,591

(22) Filed: Dec. 4, 2002

(65) Prior Publication Data

US 2004/0110312 A1 Jun. 10, 2004

(51) Int. Cl.[7] .............................................. H01L 21/66
(52) U.S. Cl. ...................................................... 438/14
(58) Field of Search ............................ 707/104; 438/14

(56) References Cited

U.S. PATENT DOCUMENTS

| | | | |
|---|---|---|---|
| 4,655,598 A | | 4/1987 | Murakami et al. |
| 4,769,523 A | | 9/1988 | Tanimoto et al. |
| 5,995,234 A | | 11/1999 | Nishi |
| 6,303,395 B1 | * | 10/2001 | Nulman ........................ 438/14 |
| 6,430,572 B1 | * | 8/2002 | Steffan et al. ............ 707/104.1 |
| 6,673,637 B2 | | 1/2004 | Wack et al. |

OTHER PUBLICATIONS

Screenshot examples of Brookside's DataViewer, AspenTech's Process Explorer, Symphony Systems' SET, and Triant Technologies Viewer.

* cited by examiner

Primary Examiner—John F. Niebling
Assistant Examiner—Andre' Stevenson
(74) Attorney, Agent, or Firm—Carr & Ferrell LLP

(57) ABSTRACT

The present invention is a system for creating a signature of a substrate manufactured in a semiconductor or data storage fabrication facility. A central processing unit is configured to receive external sensor data from a plurality of equipment-types located within the facility and integrate the external sensor data, by combining the data into a unitary whole, to create the signature for the substrate. Additionally, the present invention is a method for creating a signature of the substrate by selecting a substrate from the facility process line, receiving external sensor data associated with the substrate from a plurality of equipment-types, and integrating the external sensor data associated with the substrate to create the signature of the substrate. The created substrate signature may also be compared with other substrate signatures to electronically diagnose a process, equipment associated with the process, or a processed substrate.

8 Claims, 4 Drawing Sheets

SYSTEM AND METHOD FOR CREATING A SUBSTRATE SIGNATURE

BACKGROUND OF THE INVENTION

1. Field of the Invention

The present invention generally relates to processing of substrates used in semiconductor, data storage, and allied industries. More particularly, the present invention relates to electronically diagnosing a process, equipment associated with the process, or a processed substrate by creating a signature of the processed substrate in a semiconductor or data storage fabrication ("fab") facility.

2. Description of the Background Art

The semiconductor, data storage, and allied industries feature manufacturing lines that are rich in data production. Most pieces of fabrication or metrology equipment ("tools") have a myriad of stored data or generate data that can be collected and stored externally. The stored data may include process conditions within a process tool (e.g., process duration, process temperature, process gas flows, etc.), operating conditions of the process tool (e.g., alarm states, input/output (I/O) signal traces, vacuum and pressure levels, etc.), or general historical data for the process tool (e.g., last preventive maintenance (PM), next PM date, overall uptime, etc.).

In addition, there is also a large quantity of data available from metrology tools. Metrology data may include various substrate feature measurements such as film thickness mapping, resistivity mapping, particle mapping, die-to-database correlations, thickness mapping, resistivity mapping, particle mapping, die-to-database correlations, step height values, line-width measurements, and so on. Metrology data is typically available from both in-situ and ex-situ metrology tools. Metrology tools will frequently also store operating condition data and general historical data.

A process or line engineer can use data from a particular type of tool to evaluate processing trends, view run-rules for a given process, or perform complex statistical calculations. However, to date, this type of analysis has been limited to a particular fab tool.

Statistical techniques for controlling a process are well known in the semiconductor, data storage, and allied industries. For example, statistical process control is "the use of statistical methods to analyze a process or its output to take appropriate actions to achieve and maintain a state of statistical control and continuously improve the process capability" (SEMATECH Dictionary, http://www.sematech.org/public/publications/dict). Such appropriate actions may include monitoring or changing gas flows, temperatures, ramp rates, or the like. Other statistical techniques include using Shewhart charts (e.g., charting a group mean versus standard deviation) for evaluating run-rules according to the well-known Western Electric sensitizing rules published in 1956.

Virtually all process and metrology tool manufacturers produce a software program to view or compare collected data from a particular tool. Additionally, there are third-party software manufacturers that produce software for interfacing with a particular type of tool or type of data. These third-party software programs include AspenTech's Process Explorer; Symphony System's SET; and Brookside's Viewer for display of one or more I/O signal traces; and Triant Technologies Viewer for overlaying alarm flags with I/O data. Symphony System's SET; and Brookside's Viewer can also show trend data. Consequently, these data can be used in controlling a particular tool to optimize a portion of a fabrication process.

Disadvantageously, currently available software can only compare data for a particular type of tool. An equipment supplier typically provides a number of software analysis and comparison programs for use with their own tool or similar tools. However, currently available software is only able to read data from a single tool type.

SUMMARY OF THE INVENTION

The present invention is a system for creating a signature of a substrate manufactured in a semiconductor, data storage, or allied industry fabrication facility (hereinafter referred to as a "semiconductor or data storage fabrication facility"). The present invention includes a central processing unit where the central processing unit is capable of receiving all relevant and available external sensor data from a plurality of equipment-types located within the semiconductor or data storage fabrication facility. The central processing unit integrates the external sensor data, by combining the data into a unitary whole, to create the signature for the substrate.

The present invention is also a method for creating a signature of a substrate manufactured in a semiconductor or data storage fabrication facility. The method includes selecting a substrate from a semiconductor or data storage fabrication facility process line and receiving all relevant and available external sensor data associated with the substrate, from a plurality of equipment-types. The method then integrates, by combining the data into a unitary whole, the received external sensor data associated with the substrate to create the signature of the substrate.

Additionally, the present invention is a method for electronically diagnosing a condition of a substrate, a fabrication process, or at least one process tool within a semiconductor or data storage fabrication facility. The method includes selecting a substrate with an existing, associated signature for evaluation from the semiconductor or data storage fabrication facility process line; selecting at least one other substrate signature for comparison with the associated signature of the selected substrate; and determining a condition of the selected substrate, the fabrication process, or at least one process tool based on the comparison of the associated signature with at least one other substrate signature.

DESCRIPTION OF PREFERRED EMBODIMENTS

Figure 1:
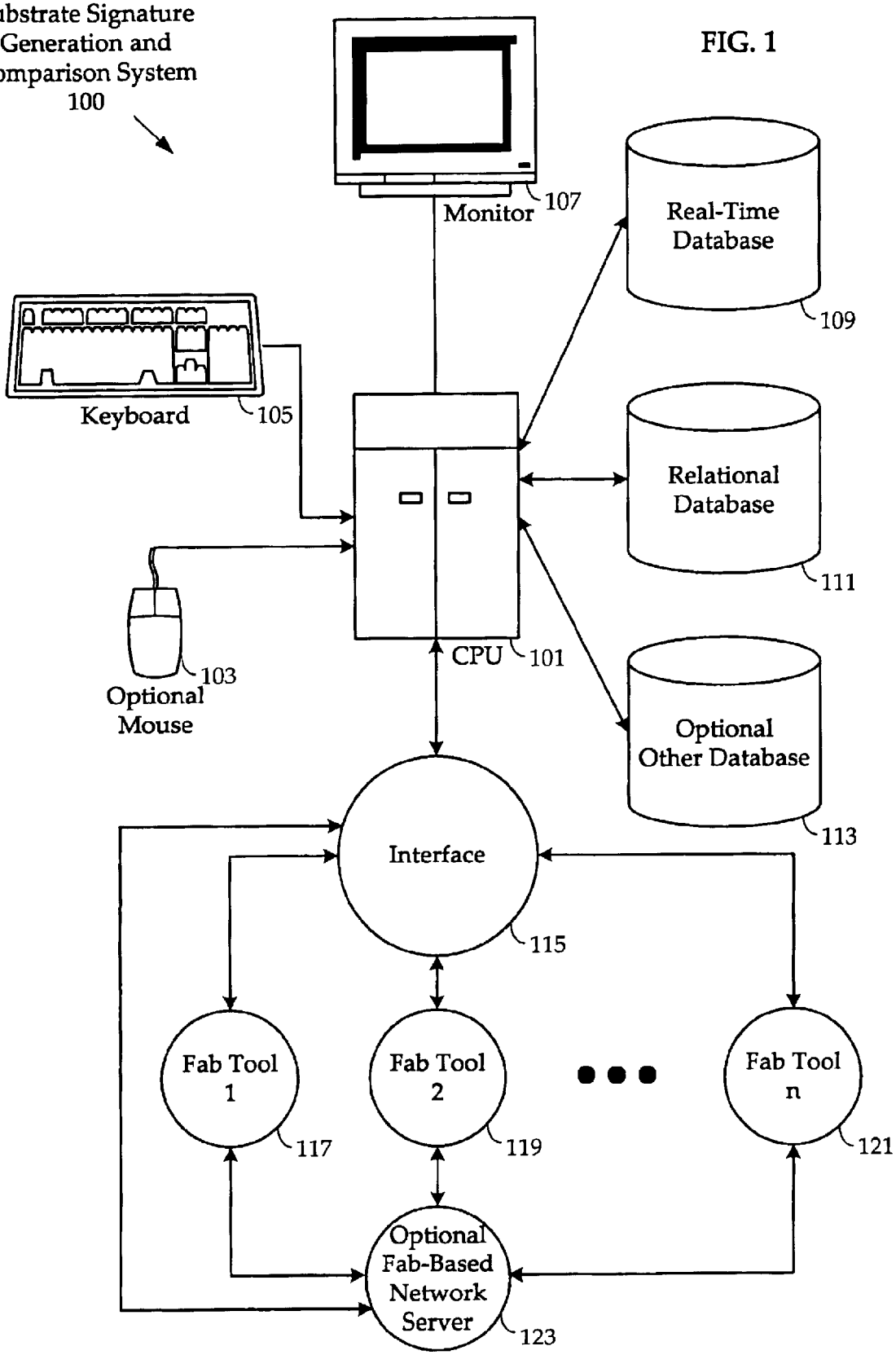
FIG. 1 is an overview diagram of an embodiment of the present invention for gathering system-wide data and creating a substrate signature.

An electronic diagnostic system of the present invention collects data for any substrate (e.g., a semiconductor wafer, a photomask, a disk media, etc.) in a semiconductor or data storage fabrication facility ("fab") from a variety of process, metrology, and other related tools. The present invention collects all relevant, available data related to a particular substrate or group of substrates at any given stage in a fab process line. A substrate signature is then created from the collected data. The collected data are combined, or integrated, to form the substrate signature by bringing together and integrating disparate pieces of data into a unitary whole. A user may also, prior to the integration of the data, select a subset of the relevant and available data or a subset of data available from a given source (e.g., a given spatial bandwidth from a metrology tool).

The substrate signature created by the integration process is used as a diagnostic tool for a fabrication process evaluation, process tool (e.g., a fab production tool) evaluation, and/or substrate evaluation. The substrate signature may be displayed or saved or the substrate signature may be compared with at least one other previously created substrate signature. Results from the substrate signature comparison indicate a health condition of the fabrication process, the process tool, or the substrate at any given point in a process.

For example, a signature of a selected substrate may be compared with signatures from other substrates or groups of substrates to judge a condition of the selected substrate (e.g., if the substrate is good, if the substrate should be scrapped, or if the substrate can be reworked) at a given step in a process line. The condition of the selected substrate will frequently indicate a condition of the entire lot of substrates from which the selected substrate is chosen, and, consequently, indicate if additional process steps are required for the entire lot or if the lot is good.

Finally, the substrate signature can be used for a root-cause analysis of a suspected problem in a fab process line. Results from the comparison or root-cause analysis may indicate a unique substrate signature. Unique substrate signatures can be saved in fault-libraries, golden-libraries, or other library types from which comparison signatures can later be chosen.

For example, an out-of-specification process may be found to produce a known-bad substrate. A substrate signature created from the known-bad substrate may be saved in a fault-library. By comparing (either visually or through an analytical or statistical technique) the substrate signature with a newly created (or current) substrate signature, an out-of-specification condition of a current process can be recognized quickly. Once the out-of-specification process condition is recognized, measures can be taken to control the process.

System-wide data-integration capability of this scale is not currently available outside of the present invention. Currently available products used for comparison or analysis of substrates, fab processes, or fab tools are only capable of displaying or comparing a subset of the data gathered by the present invention. Currently available products are incapable of integrating all relevant, available data from a variety of production, metrology, and other related tools and sensors into a unitary whole.

FIG. 1 is an exemplary overview diagram of an embodiment of the present invention showing a substrate signature generation and comparison system 100 for gathering all relevant, available data for a selected substrate and creating a signature of the selected substrate. As shown, various components are part of the substrate signature system generation and comparison system 100. These components include a central processing unit (CPU) 101, an optional mouse 103 or similar input/pointing device, a keyboard 105, a monitor 107 or other display device, a real-time database 109, a relational database 111, and an optional other database 113. The FIG. 1 embodiment also includes an interface 115, for connecting to a plurality of fab tools 117–121 and optionally connecting to an optional fab-based network server 123.

The CPU 101 may be a dedicated personal computer or workstation, a network server or other non-dedicated computer, or may be a CPU contained within one or more of the plurality of fab tools 117–121. The CPU 101 contains a software program for gathering all relevant, available substrate data, creating and storing a substrate signature, retrieving one or more stored substrate signatures, and either displaying the substrate signature or comparing the substrate signature with at least one other stored substrate signature. Optionally, the CPU 101 may be a dedicated logic circuit (such as one or more ASIC devices) configured to perform one or more functions of the software program (described in more detail herein).

The optional mouse 103 and keyboard 105 permit a user of the substrate signature generation and comparison system 100 to input data and respond to system prompts generated by the CPU 101. The optional mouse 103 may instead be another user-operated input/pointing device such as a trackball or joystick.

The monitor 107 displays typical data input/output generated by the user or software contained in the CPU 101 such as software prompts, tabular data, and graphical displays. The monitor 107 is also used to display and compare substrate signature data (described in further detail herein).

The real-time database 109 contains comparison libraries, may store substrate signature data, and allows for rapid retrieval of substrate signatures and library data. The relational database 111 may also store substrate signature data while allowing for much more extensive queries than possible with the real-time database 109. The optional other database 113 stores peripheral or supplemental data related to substrate signatures. All databases 109–113 may be either internal or external to the CPU 101 and may additionally contain fault-library databases, golden-library databases or other types of library databases. The databases 109–113 may be separate physical drives or may simply be separate partitions or sections on a single drive. The databases 109–113 may also reside on the optional fab-based network server 123. Such databases are discussed in further detail herein.

The interface 115 connects the CPU 101 to the plurality of fab tools 117 121 and/or an optional fab-based network server 123. The interface 115 may be either a software and/or electronic device configured to interface with external components such as the plurality of fab tools 117–121 or the optional fab-based network server 123. Additionally, the interface 115 may be either internal or external to the CPU 101.

A fab tool can be any instrument, machine, or device used to perform a task or to measure a characteristic or quality of a substrate or the like. In the semiconductor industry, a fab tool is any piece of semiconductor fabrication equipment designed to process wafers (e.g., an ion implanter, a photo-lithographic stepper, a chemical vapor deposition system, etc.) or inspection equipment designed to measure or inspect wafers (e.g., a scanning surface inspection system, a critical-dimension scanning electron microscope, a spectroscopic ellipsometer, etc.).

Typically, each of the plurality of fab tools 117–121 has its own processing and data storage and retrieval system for maintaining tool processing conditions, alarm data, maintenance data, and the like. Alternatively, data from the plurality of fab tools 117–121 may be located on an external optional fab-based network server 123. In either case, data from the plurality of fab tools 117–121 is connected to the CPU 101 through the interface 115.

Figure 2:
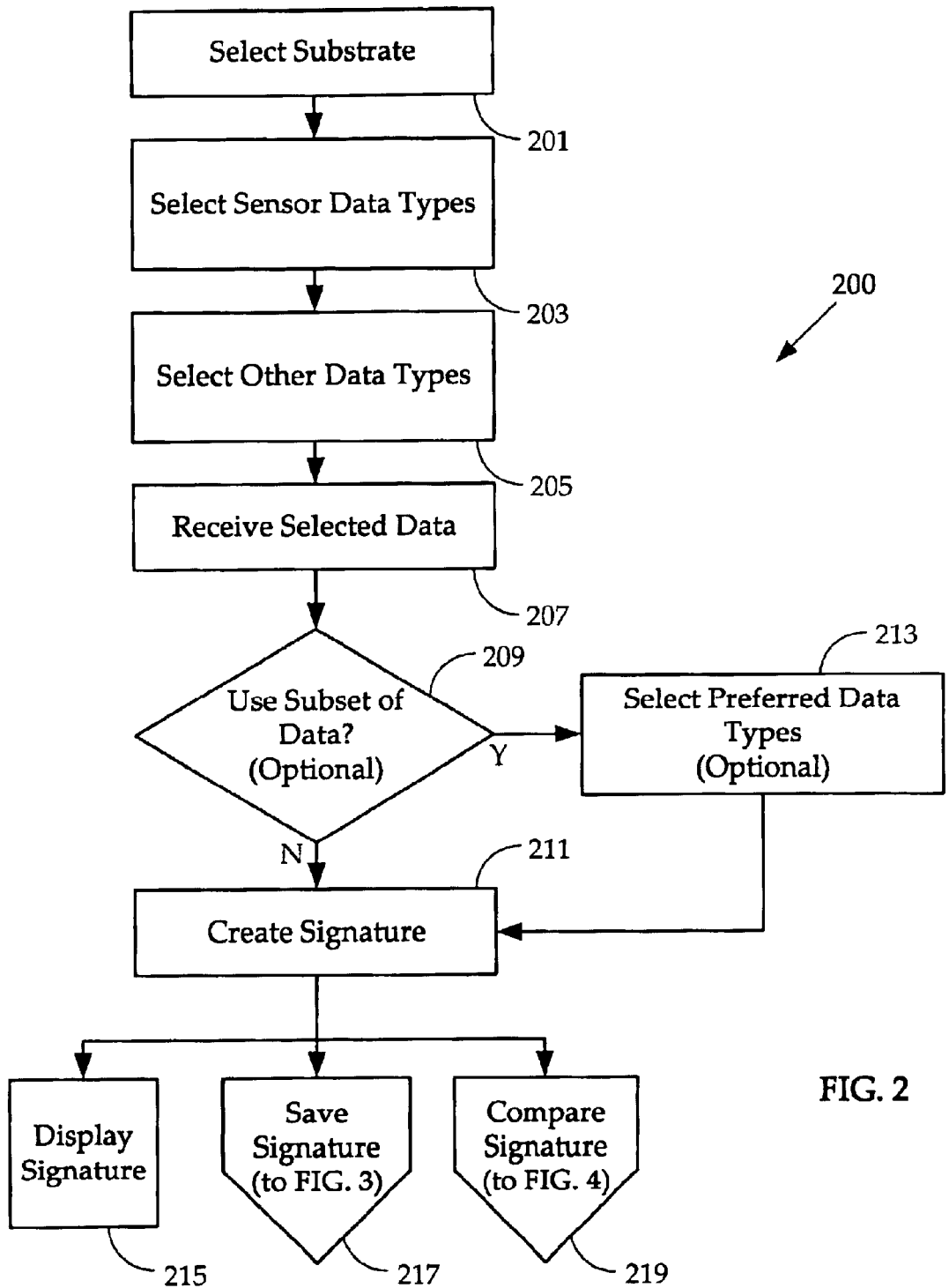
FIG. 2 is a flowchart of an exemplary method for selecting and receiving sensor data and creating the substrate signature.

FIG. 2 is a flowchart 200 of an exemplary method for creating a substrate signature. Initially, a user is prompted to select 201 a substrate for which a signature is desired. The substrate is typically selected by process recipe, process or substrate lot, cassette or boat slot number, process date, and/or process time. The user is then prompted to select 203 sensor data types associated with the substrate. Alternatively, the user may select all available sensor data associated with the substrate. Such sensor data may include data from optical emissions spectroscopy (OES), Fourier-transform infrared (FTIR) spectroscopy, residual gas analyzer (RGA) instruments, etc. An additional prompt is made for the user to select 205 any other data types that may be associated with the substrate. Alternatively, a user may choose to select all of the other data types associated with the substrate. These other data types may include maintenance performed on a tool or set of tools on which the substrate was run, alarm activity associated with one or more tools, other events associated with one or more tools, and other types of recorded data associated with the substrate. Optionally, the prompt for selecting 203 the sensor data type and the prompt for selecting 205 the other data types may be combined into one system-generated prompt.

Once the user has entered a response 201–205 to the prompts, the substrate signature generation and comparison system 100 receives 207 the selected data from various other databases. These other databases may be contained on the plurality of fab tools 117–121, or may be located on the optional fab-based network server 123.

Optionally, once the selected data have been received, the user is queried 209 as to whether a subset of the received selected data is desired. In some instances, there are more data than the user may actually wish to use to create a substrate signature. If the user elects to use a subset of the received selected data, the user selects 213 one or more preferred data types. The substrate signature generation and comparison system 100 then creates a substrate signature 211.

The substrate signature is an integration of all received selected data chosen by the user, or the optionally selected subset of the received selected data. Such data may be in the form of tabular, flat-file, or other formats as received from the plurality of fab tools 117–121 or the optional fab-based network server 123. Methods for displaying, reading, retrieving, and saving such data are well-known by one of ordinary skill in the art. The integration of all the received selected data, or the optionally selected subset of the received selected data, is performed by combining the data into a unitary whole. Methods for combining data files of disparate data types are well-known in the art.

Figure 3:
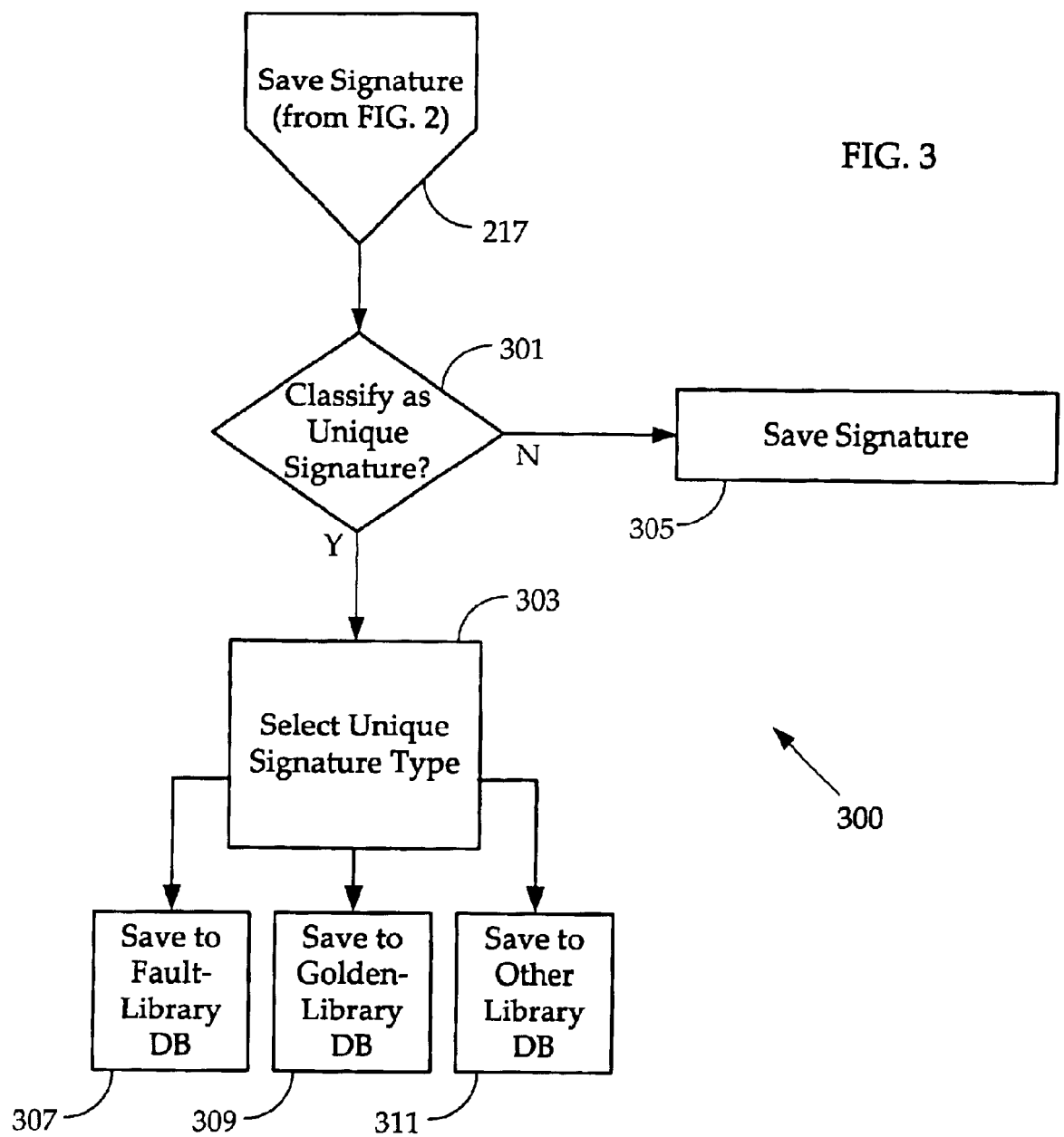
FIG. 3 is a flowchart of an exemplary method for saving the substrate signature created by the method shown in FIG. 2.

Once the substrate signature is created 211, it may be displayed 215, saved to a storage device and/or database 217, or compared with one or more previously generated substrate signatures 219. FIG. 3 is a flowchart 300 of an exemplary method for saving a substrate signature in accordance with an embodiment of the present invention. Initially, a user is queried 301 as to whether a substrate signature should be classified as a unique signature. If the user chooses to not classify the substrate signature as a unique signature, the substrate signature is simply saved 305 to a data-storage device, non-volatile random-access-memory (RAM), or the like. If the user chooses to classify the substrate signature as a unique signature, the user is prompted 303 to select a unique signature type for the substrate signature. The substrate signature may then be saved 307 to a fault-library database, saved 309 to a golden-library database, or saved 311 to some other type of library database.

A unique substrate signature demonstrates a unique aspect of a process, a process tool, and/or a substrate. For example, one or more dice (or "die" as commonly referred to in the plural form in industry) on a substrate may test electrically to specification and within extremely tight tolerances. The substrate containing such dice is a known-good substrate and is commonly referred to as a "golden-wafer." Fab personnel will try to replicate a process and/or process conditions as closely as possible to produce additional substrates of similar high quality as found in the golden-wafer. By classifying a substrate signature from a known-good substrate as a unique signature and saving 309 the unique signature to the golden-library database, the unique substrate serves as an exemplary signature for comparison with other substrate signatures.

The database libraries are typically contained within one or more of the databases 109–113 (FIG. 1). As such, the database libraries are subsets of the larger databases 109–113. Alternatively, the database libraries may be contained on the optional fab-based network server 123 or some other storage device, such as an optical storage device or non-volatile RAM.

Figure 4:
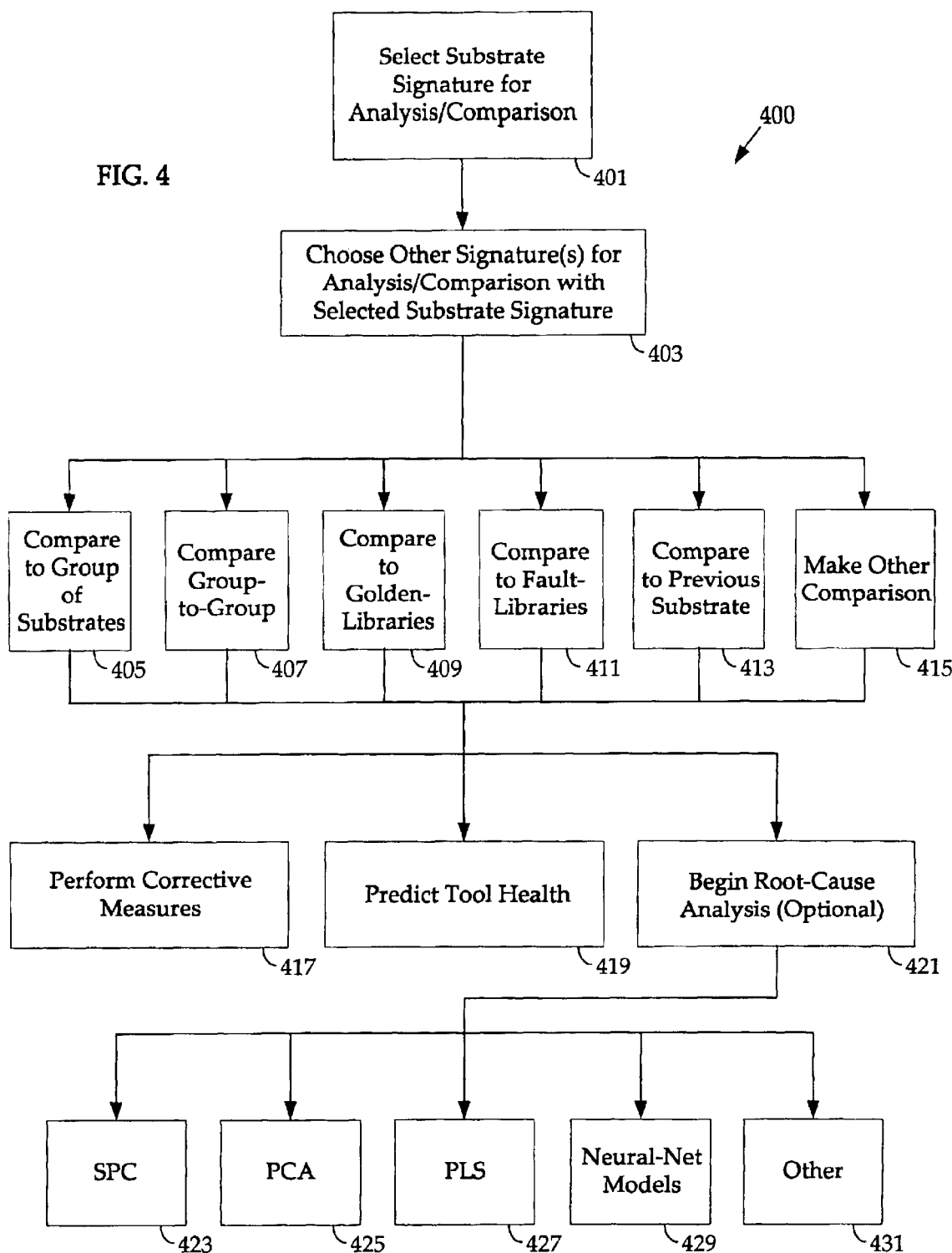
FIG. 4 is a flowchart of an exemplary method for analyzing and/or comparing the substrate signature created by the exemplary method shown in FIG. 2.

FIG. 4 is a flowchart 400 of an exemplary embodiment for analyzing and/or comparing a substrate signature with one or more other substrate signatures in accordance with an embodiment of the present invention. The process of analyzing and/or comparing can be used, for example, to electronically diagnose a substrate, a fabrication process, or a process tool within a semiconductor or data storage fabrication facility. Initially, a user is prompted to select 401 a substrate signature for analysis and/or comparison with one or more other substrate signatures contained within one or more of the database libraries. Although the following description is generally described in terms of analyzing and/or comparing a single selected substrate signature, the description and flow are equally applicable to a group of selected substrate signatures.

The substrate signature selected for analysis and/or comparison with other substrate signatures may be retrieved from a saved signature 305, or a signature saved 307–311 to one of the library databases. Alternatively, the selected substrate signature may not be saved but merely be displayed 215 (FIG. 2). The user is then prompted to choose 403 one or more other substrate signatures from the database libraries for analysis and/or comparison with the selected substrate signature. The selected substrate signature may be analyzed-against and/or compared-with 405 signatures chosen from a group of substrates. Optionally, the selected substrate signature may be analyzed-against and/or compared-with 409, 411 one or more signatures (other than the substrate signature already selected) chosen from a golden-library or fault-library.

If more than one substrate signature was initially selected 401 (i.e., a group of substrate signatures), then the selected group of substrate signatures may be analyzed-against and/or compared-with 407 an existing group of substrate signatures. The selected group of substrate signatures may also be analyzed-against and/or compared-with substrate signatures saved in the golden, fault, or other library databases.

A selected signature may also be analyzed-against and/or compared-with 413 a previous substrate signature (frequently, the previous substrate signature was created in close time proximity to the substrate signature selected 401 for analysis/comparison). Finally, the selected substrate signature may be analyzed and/or compared 415 in some other way as defined by a user, such as a process or line engineer.

These analysis/comparison steps 405–415 may be performed in different ways. One way in which to perform the analysis/comparison is for the user to visually evaluate various substrate signatures utilizing the data format of the signatures.

For example, substrate signatures in tabular form may be placed side-by-side. In this case, the process or line engineer may look for excursions or trends in the data to indicate an out-of-specification tool or process. Such substrate signatures in tabular form may also be graphed and then compared to more readily discern trends or run-rules. Graphs may be produced utilizing a commercial spreadsheet package or some other available graphing package. In another example, graphs produced from one or more selected substrate signatures may be overlaid with graphs produced from other chosen substrate signatures to directly compare some feature(s) of the selected one or more substrate signatures in comparison with one or more other chosen substrate signatures. The latter one or more chosen substrate signatures are chosen, for example, from a golden-library.

An analysis and/or comparison of the selected substrate signature may indicate a processing error. If a processing error is indicated, a corrective measure 417 may be used to feed back or feed forward a process change to correct or compensate for the processing error. If a feed back process change is indicated (e.g., to benefit any additional substrate lots subsequently processed), the process change would need to be fed back to a point in the process line upstream from where the selected substrate was first selected 401. Sending the process change to a point upstream from where the selected substrate was selected prevents additional substrates that are later processed from having the same processing errors as the selected substrate. The process change could include, for example, a change in process temperature, gas flow, deposition time, and the like. In a similar way, a corrective measure 417 may also feed forward a process change to a point in the process line downstream from where the selected substrate was first selected 401. This feed forward process provides compensating process changes, if needed, to correct for any process deficiencies or errors on substrates already processed. An example of a corrective measure 417 in a feed forward process change involves compensating for an overly-thick silicon dioxide deposition. A feed forward process change could require a longer than normal chemical-mechanical-planarization (CMP) time downstream of an oxide deposition system. The longer than normal CMP time would remove excess oxide from the substrates. In this way, the feed forward process change would compensate for substrates affected by processing errors (in this case, an overly-thick deposition) without having to scrap or rework the substrates.

Additionally, an analysis and/or comparison of substrate signatures may necessitate a corrective measure 417 of a process or line engineer stopping a production line or flagging an operator (e.g., for monitoring a process more closely, adjusting a process condition, sending substrates for scrap or rework, or for additional training of the operator).

In addition to performing corrective measures 417, the analysis and/or comparison may be used to 419 predict or judge a condition of tool health. For example, a substrate signature stored in the fault-library may be indicative of the results of a process chamber in a deposition tool requiring cleaning. If a comparison between a selected substrate signature and a saved substrate signature from the fault library indicates similar characteristics between the two signatures, the comparison is useful in predicting that the process chamber will soon require cleaning.

Finally, if a comparison of a selected substrate signature with one or more other substrate signatures is inconclusive, or if a process or line engineer desires more detailed information, then an optional root-cause analysis 421 can be performed. The optional root-cause analysis 421 provides more detailed analysis of the data contained within the selected substrate signature. The more detailed analysis may take the form of one or more of the following statistical techniques: statistical process control (SPC) analysis 423, principle component analysis (PCA) 425, partial-least-squares (PLS) regression 427, neural-net modeling 429, or other statistical procedures 431. All of these statistical techniques are well-known to one skilled in the art.

Results from such statistical analysis 423–431 may indicate that the selected substrate signature is a unique substrate signature. As a unique substrate signature, the unique substrate signature type could then be selected 303 (FIG. 3) and saved 307–311 to one or more of the database libraries.

The present invention has been described above with reference to specific embodiments. It will be apparent to one skilled in the art that various modifications may be made and other embodiments can be used without departing from the broader scope of the present invention. For example, although the present invention has been exemplarily described in terms of a deposition or etch tool, it would be obvious to one skilled in the art to modify the present invention for any other type of processing or metrology tool.

What is claimed is:

1. A system for creating a signature of a substrate manufactured in a semiconductor or data storage fabrication facility, comprising:
   a central processing unit, the central processing unit configured to receive external sensor data from a plurality of equipment-types located within the semiconductor or data storage fabrication facility;
   an interface adapted for coupling the central processing unit to the plurality of equipment-types located in the semiconductor or data storage fabrication facility; and
   the central processing unit being further configured to integrate the external sensor data to create the signature of the substrate.

2. The system of claim 1, further comprising:
   a fault-library coupled to the central processing unit, the fault-library configured to store and retrieve signature data from known-bad substrates; and
   a golden-library coupled to the central processing unit, the golden-library configured to store and retrieve signature data from known-good substrates.

3. The system of claim 1, further comprising a real-time database coupled to the central processing unit and a relational database coupled to the central processing unit, the real-time database and the relational database each configured to save the created signature of the substrate.

4. The system of claim 1, wherein the external sensor data comprises process data and metrology data.

5. The system of claim 1, further comprising the central processing unit being configured to receive a plurality of other data from a semiconductor or data storage fabrication facility and wherein the central processing unit configured to integrate the external sensor data being further configured to integrate the plurality of other data with the external sensor data to create the signature of the substrate.

6. The system of claim 5, wherein the other data comprises maintenance data, alarm data, historical process data, and event data.

7. The system of claim 1, wherein the integration of the external sensor data is accomplished by combining the data into a unitary whole.

8. A system for creating a signature of a substrate manufactured in a semiconductor or data storage fabrication facility, comprising:

a means for receiving external sensor data associated with the substrate from a plurality of equipment-types located within the semiconductor or data storage fabrication facility; and a means for integrating the external sensor data to create the signature of the substrate.

* * * * *